United States Patent [19]

Klinshteyn

[11] Patent Number: 5,611,239
[45] Date of Patent: Mar. 18, 1997

[54] MICROWAVE POINT INSTRUMENT WITH SELF-TEST CIRCUIT

[75] Inventor: Leonid Klinshteyn, Buffalo Grove, Ill.

[73] Assignee: Magnetrol International Inc., Downers Grove, Ill.

[21] Appl. No.: 309,927

[22] Filed: Sep. 21, 1994

[51] Int. Cl.$^6$ .......................... G01F 23/20; G01R 27/06
[52] U.S. Cl. .................... 73/290 V; 73/290 R; 324/637; 324/648
[58] Field of Search .......................... 73/290 R, 290 B, 73/29 V; 340/612, 618; 333/121, 122; 324/637, 642, 644, 647, 648

[56] References Cited

U.S. PATENT DOCUMENTS

| | | | |
|---|---|---|---|
| 2,498,548 | 2/1950 | Howard | 250/39 |
| 2,596,531 | 5/1952 | Clarke | 73/67 |
| 2,597,327 | 5/1952 | Hollingsworth | 333/122 |
| 2,611,804 | 9/1952 | Zaleski | 175/183 |
| 2,798,197 | 7/1957 | Thurston | 324/648 |
| 2,864,953 | 12/1958 | De Lange | 333/121 |
| 2,903,653 | 9/1959 | Grantham et al. | 333/121 |
| 2,934,658 | 4/1960 | Lewis | 333/122 |
| 2,946,965 | 7/1960 | Albanese | 333/121 |
| 3,182,203 | 5/1965 | Miller | 333/121 |
| 3,258,688 | 6/1966 | Augustine et al. | 324/644 |
| 3,271,668 | 9/1966 | Haake et al. | 324/637 |
| 3,572,119 | 3/1971 | Bak | 73/290 |
| 3,594,667 | 7/1971 | Mann | 333/98 |
| 3,657,668 | 4/1972 | Craven et al. | 333/122 |
| 3,818,333 | 6/1974 | Walker | 324/640 |
| 3,836,846 | 9/1974 | Overall et al. | 324/643 |
| 3,921,106 | 11/1975 | Williams | 333/81 R |
| 4,044,355 | 8/1977 | Edvardsson | 342/124 |
| 4,045,727 | 8/1977 | Yu et al. | 324/644 |
| 4,055,252 | 10/1977 | Klamm et al. | 209/524 |
| 4,107,993 | 8/1978 | Shuff et al. | 73/290 R |
| 4,144,517 | 3/1979 | Baumoel | 367/93 |
| 4,210,023 | 7/1980 | Sakamoto et al. | 73/290 R |
| 4,218,678 | 8/1980 | Fowler et al. | 342/22 |
| 4,238,795 | 12/1980 | Schick et al. | 342/127 |
| 4,339,648 | 7/1982 | Jean | 219/697 |
| 4,359,902 | 11/1982 | Lawless | 73/290 R |
| 4,375,057 | 2/1983 | Weise et al. | 187/394 |
| 4,425,793 | 1/1984 | Turton et al. | 73/290 R |
| 4,458,530 | 7/1984 | Bastida | 73/290 R |
| 4,566,321 | 1/1986 | Zacchio | 73/290 R |
| 4,588,966 | 5/1986 | Horn et al. | 331/96 |
| 4,588,967 | 5/1986 | Horn et al. | 331/107 G |
| 4,670,754 | 6/1987 | Zacchio | 342/124 |
| 4,765,705 | 8/1988 | Seymour et al. | 385/37 |
| 4,833,918 | 5/1989 | Jean et al. | 73/290 V |
| 5,351,036 | 9/1994 | Brown et al. | 340/618 |

*Primary Examiner*—Richard Chilcot
*Assistant Examiner*—Paul D. Amrozowicz
*Attorney, Agent, or Firm*—Wood, Phillips, VanSanten, Clark & Mortimer

[57] ABSTRACT

A microwave point level instrument is adapted to detect level or change of products in a storage vessel. The instrument includes a microwave transducer periodically developing a pulse of microwave energy. A microwave bridge is driven by the transducer for receiving pulses of microwave energy. The bridge includes a reference arm receiving a portion of each pulse of microwave energy to be altered by a variable impedance tuning circuit. A measurement arm receives another portion of each pulse of microwave energy to be altered by dielectric properties of a product at a process seal installed in a storage vessel, in use. A detector arm develops a microwave signal responsive to imbalance in the bridge between the microwave energy altered by the tuning circuit and the microwave energy altered by the dielectric properties of the product. A sensing circuit is coupled to the bridge detector arm for developing an electrical signal responsive to the microwave signal representing the imbalance. A self-test circuit is operatively associated with the bridge for automatically varying the impedance in the bridge to simulate effects of a change of dielectric properties of a product at the process seal. An output circuit is operatively driven by the sensing circuit for indicating the determined imbalance.

14 Claims, 8 Drawing Sheets

MICROWAVE POINT INSTRUMENT WITH SELF-TEST CIRCUIT

FIELD OF THE INVENTION

This invention relates to microwave point instruments and, more particularly, to a self-test circuit therefor.

BACKGROUND OF THE INVENTION

Microwave point instruments can be used in liquid or bulk material applications. The microwave instrument provides detection of level at the installation point or change of products inside a liquid or bulk material storage and process vessels. There are no moving parts in contact with the medium.

A known microwave point level switch in one form utilizes a microwave generator periodically developing a pulse of microwave energy. The energy is directed to a waveguide configured as an electromagnetic bridge. The microwave pulse is divided into a measurement arm and reference arm. The reference arm includes tunable reference means for altering the microwave energy using a variable impedance tuning circuit. The measurement arm includes a process seal disposed in the vessel at a position at which the material is to be detected. The dielectric properties of the material in the vessel alter the microwave energy delivered thereto. In a waveguide configured as the well-known "magic-T" the altered signals from the reference arm and measurement arm are combined to develop a microwave signal in a detector arm equal to the difference between the altered microwaves. The magic-T bridge is calibrated for a select product by using the variable impedance tuning circuit to provide a null output when balanced. A sensing circuit coupled to the detector arm determines if the system is out of balance by sensing voltage changes.

As with any process instrument, testing of the instrument is important. While instruments often include means for testing circuits, it is often difficult to test the entire instrument, including the sensing apparatus. One known magic-T based microwave level switch uses a test port openings in the reference arm. A small tool such as a screwdriver can be placed in the test port to simulate change in process conditions. While this can be an effective test, the test requires that the instrument housing be opened to access the waveguide. Practically, this cannot be done on line or with any regularity.

The present invention is directed to overcoming one or more of the problems discussed above in a novel and simple manner.

SUMMARY OF THE INVENTION

In accordance with the invention there is provided a microwave point level system including a self-test circuit for automatically testing the instrument.

Broadly, there is disclosed herein a microwave point level instrument adapted to detect level or change of products in a storage vessel. The instrument includes a nicrowave transducer periodically developing a pulse of microwave energy. A microwave bridge is driven by the transducer for receiving pulses of microwave energy. The bridge includes tunable reference means receiving a portion of each pulse of microwave energy to be altered by a variable impedance tuning circuit. Measuring means receive another portion of each pulse of microwave energy to be altered by dielectric properties of a product at a process seal installed in a storage vessel, in use. A detector means develops a microwave signal responsive to imbalance in the bridge between the microwave energy altered by the tuning means and the microwave energy altered by the dielectric properties of the product. Sensing means are coupled to the bridge detector means for developing an electrical signal responsive to the microwave signal representing the imbalance. A self-test circuit is operatively associated with the bridge for automatically varying the impedance in the bridge to simulate effects of a change of dielectric properties of a product at the process seal. An output circuit includes means operatively driven by the sensing means for indicating the determined imbalance.

It is a feature of the invention that the microwave bridge comprises a magic-T bridge waveguide.

It is another feature of the invention that the tunable reference means comprises capacitive and resistive tuning elements.

It is still another feature of the invention that the self-test circuit varies impedance of the tunable reference means.

It is another feature of the invention that the microwave bridge comprises a waveguide having a reference arm and a measurement arm, the reference arm including the tunable reference means and the measurement arm including the process seal.

It is still another feature of the invention that the self-test circuit comprises a tuning element disposed in the reference arm.

It is yet another feature of the invention that the tuning element comprises a diode in the waveguide reference arm.

It is still a further feature of the invention that the self-test circuit includes a timer circuit periodically driving a tuning element operatively associated with the tuning circuit.

It is yet an additional feature of the invention that the self-test circuit comprises a magnetically actuated switch for driving a tuning element when a magnet is placed in proximity to the instrument.

It is still a further feature of the invention that the output means develops a null signal when the bridge is in a balance condition and the output circuit comprises a comparator circuit for comparing the electrical signal to a reference to develop an output signal having a discrete state depending on the balance condition of the bridge.

It is still another feature of the invention that the output circuit comprises a relay actuated according to the discrete state of the output signal.

It is yet a further feature of the invention that the instrument comprises a two wire 4–20 milliamp current loop powered instrument receiving a current signal and wherein the output circuit varies level of loop current according to the discrete state of the output signal.

It is still an additional feature of the invention that the output means develops a null signal when the bridge is in a balance condition and the output circuit comprises a comparator circuit for comparing the electrical signal to a reference to develop a proportional output signal having a level depending on the balance condition of the bridge.

It is still an additional feature of the invention that the instrument comprises a loop powered instrument receiving a current signal and wherein the output circuit varies level of loop current according to the level of the output signal.

Further features and advantages of the invention will be readily apparent from the specification and from the drawing.

DETAILED DESCRIPTION OF THE INVENTION

Figure 1A:
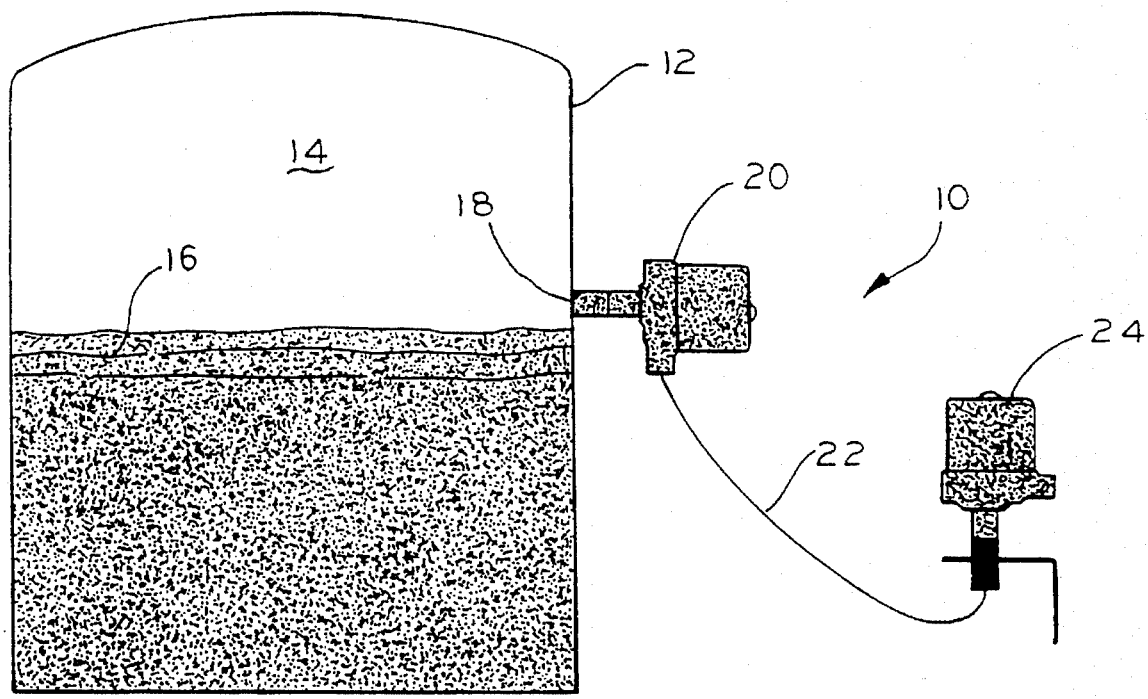
FIG. 1A is a generalized view illustrating a microwave point level instrument according to the invention mounted in a process vessel.

Referring to FIG. 1A, a microwave point level instrument 10 according to the invention is illustrated mounted to a process vessel 12. The process vessel 12 may take any known form. In the illustrated embodiment, the process vessel 12 defines an internal storage space 14 partially filled with a material 16. The point level instrument 10 provides detection of level of the material 16 at the installation point 18 in the vessel 12 or a change of product in the space 14. The instrument 10 includes no moving parts in contact with the material 16.

In accordance with the invention, the instrument 10 detects difficult process media such as hydrocarbon/water emulsion (rag layer) in separator vessels. The instrument 10 includes a continuous self-test and manual self-test features to help assure proper operation.

The instrument 10 includes an intrinsically safe tank mount sensing unit 20 connected via a cable 22 to a remotely mounted power supply unit 24.

Figure 1B:
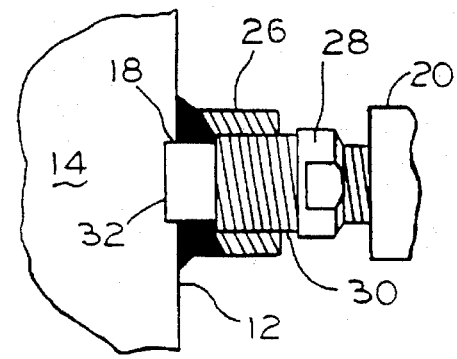
FIG. 1B is a detailed view illustrating the instrument of FIG. 1 mounted to the process vessel.

As shown in detail in FIG. 1B, the vessel 12 includes a one inch NPT pipe adaptor 26 mounted at the location 18. The sensing unit 20 includes a probe 28 including a one inch NPT threaded portion 30 received in the adaptor 26. The portion of the probe 28 extending into the vessel space 14 is closed with a TFE process seal 32.

As described below, the microwave point level instrument 10 senses changes in impedance mismatch between the sensing unit 20, at the process seal 32, and the material 16 and reacts to such changes accordingly. This impedance mismatch is the result of different dielectric properties in various products. As the material in the vessel 12 reaches immediate proximity with the process seal 32, the signal sensed by sensing unit electronics is altered, changing a relay contact position. As the material 16 is removed from immediate proximity with the process seal 32, the relay position reverses.

Figure 2:
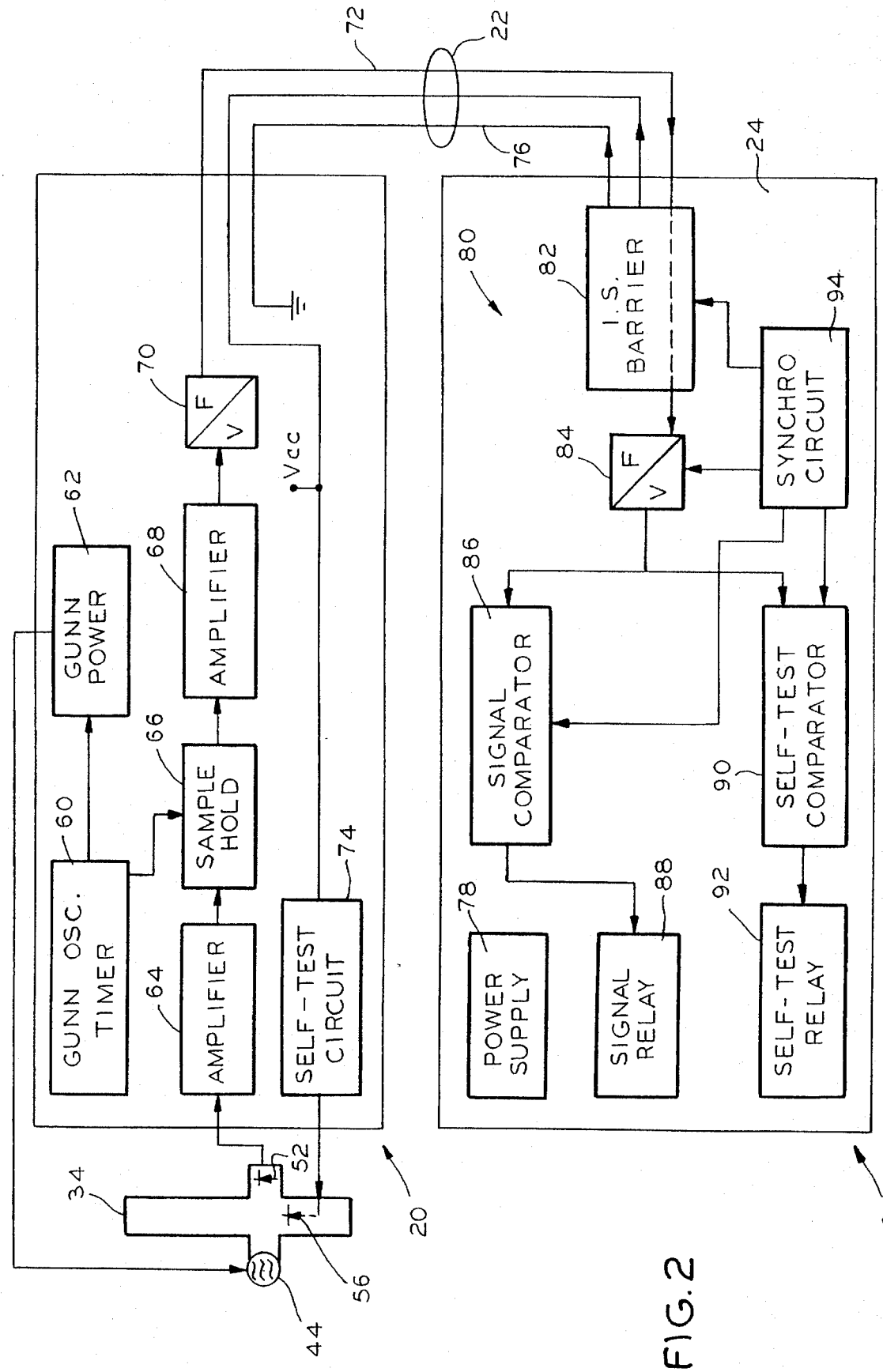
FIG. 2 is a block diagram of the point level instrument of FIG. 1.
Figure 3:
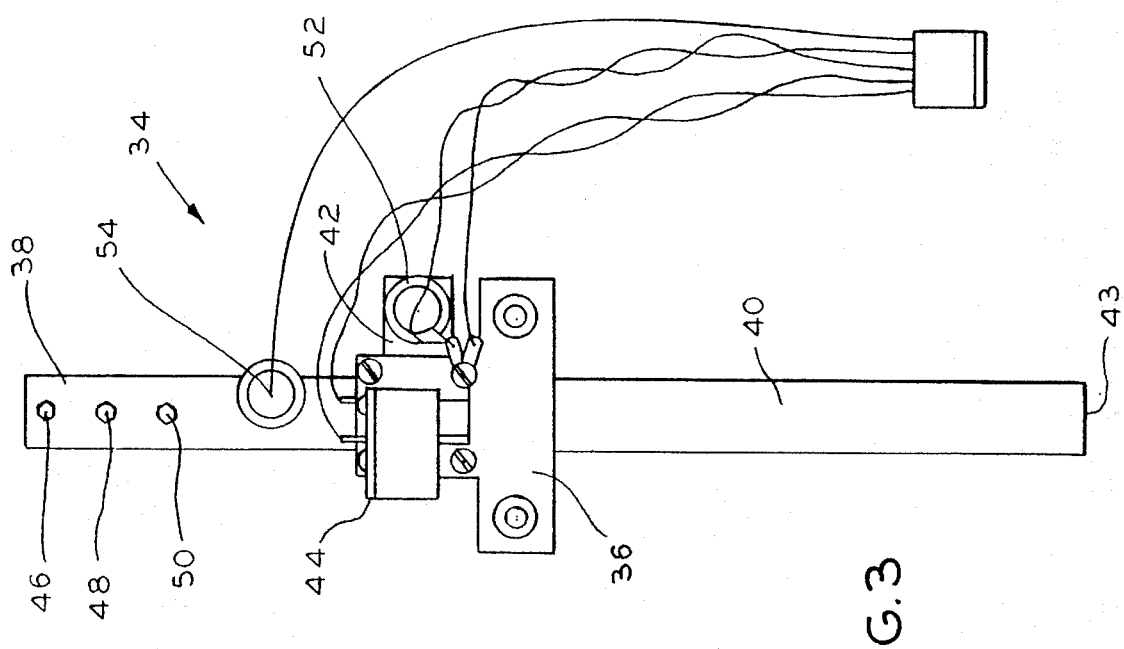
FIG. 3 comprises a front elevation view of the waveguide for the instrument of FIG. 1.

Referring to FIG. 2, the instrument 10 is illustrated in block diagram form including the sensing unit 20 and the power supply unit 24. The sensing unit 20 includes a waveguide 34. In the illustrated embodiment of the invention, the waveguide 34 comprises a "magic-T" bridge. The magic-T bridge 34 is, in a way, a microwave version of an ordinary Wheatstone bridge. The waveguide 34 is illustrated in greater detail in FIGS. 3 and 4 and includes a generator arm 36, a reference arm 38, a measurement arm 40 and a detector arm 42. The waveguide 34 is installed in the sensing unit 20 with the measurement arm 40 extending into the probe 28. A distal end 43 is proximate the process seal 32. A Gunn oscillator 44 is operatively coupled to the generator arm 36. The Gunn oscillator 44 iS driven, as described below, to deliver pulses of microwave energy at 24 GHz into the generator arm 36. As is conventional with magic-T waveguides, the microwave energy is equally divided so that a portion of the microwave energy is delivered to the reference arm 38, and another portion of the microwave energy is delivered to the measurement arm 40. The microwave energy delivered to the reference arm 38 is phase and amplitude adjusted using capacitive tuning elements 46 and 48 and a resistive tuning element 50. The microwave energy delivered to the measurement arm 40 is phase and amplitude adjusted as the wave is reflected from a measured medium, such as the material 16 in the vessel 12. Particularly, after being reflected off the medium, the wave carries information about the complex permittivity of the medium. The reference wave has amplitude and phase which are constant in time dependent on the selective adjustment of the tuning elements 46, 48 and 50. In accordance with features of a magic-T approach, the detector arm 42 provides destructive interference between the reflective measurement wave and the reflected reference wave. The resulting wave amplitude depends on both the phases and amplitudes of the interfering waves.

The reference arm is normally tuned using the tuning elements 46, 48 and 50 to match the impedance of the measurement arm 40 for a select material so that no signal appears at the detector arm 42. When the product in front of the measurement arm is changed, the detector's output changes. The output in the detector arm is sensed using a detector diode 52.

Figure 4:
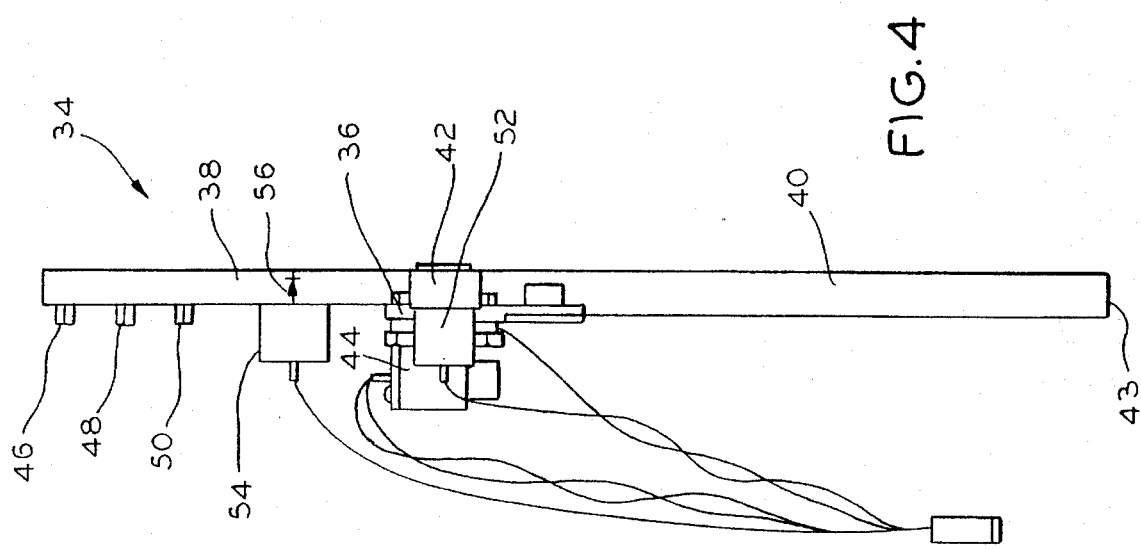
FIG. 4 is a side elevation view of the waveguide of FIG. 3.

In accordance with the invention, a self-test diode 54 is installed on the reference arm 38 and includes a diode 56 within the waveguide, see FIG. 4, for use in testing operation of the instrument 10, as discussed below.

With particular reference to FIG. 2, the sensing unit 20 includes a Gunn oscillator timing circuit 60 which generates a one millisecond pulse every twenty milliseconds, for a five percent duty cycle. The oscillator timer drives a Gunn power circuit 62 which provides up to 100 milli-amp current for driving the Gunn oscillator 44. The Gunn power circuit 62 includes voltage regulation functions as well as temperature compensation.

The detector diode 52 is connected to an amplifier circuit 64 to provide suitable gain for the detected microwave signal. The amplified signal is provided to a sample hold circuit 66 which converts pulses from the amplifier 64 into DC level. The sample hold circuit 66 is also connected to the timer circuit 60 using a delay circuit which turns on the sample and hold circuit 66 only for the last half of a signal pulse. This allows more reliable data to be obtained by ignoring turn on effects in the Gunn oscillator 44 and detector diode 52. The output of the sample and hold circuit is supplied to a second amplifier circuit 68 to provide additional gain and level shifting. A voltage to frequency converter 70 converts voltage level into frequency, alternating its duty cycle. The frequency signal is delivered via line 72 forming part of the cable 22 to the power supply unit 24. A self-test circuit 74, described more particularly below, receives signal on a line 76, also forming part of the cable 22, for driving the self-test diode 56.

The power supply unit 24 includes a conventional power supply 78 for converting external power to levels appropriate for powering components in both the power supply unit 24 and the sensing unit 20.

A comparator circuit 80 contains most of the logic circuitry controlling operation of the microwave unit 10. The return signal on a line 72 is supplied through an intrinsic safety barrier 82 to a frequency to voltage converter 84 to return the detected signal to a DC level. The DC signal is supplied to a signal comparator circuit 86 which compares the returned signal to a reference. The signal comparator 86 drives a signal output relay 88. Particularly, the signal comparator 86 is calibrated so that when the bridge 34 is in a balance condition, the null signal is sensed by the amplifier 64, the signal relay 88 is maintained in a select on or off failsafe mode, as desired.

The voltage signal from the frequency to voltage converter 84 is also supplied to a self-test comparator 90, which in turn drives a self-test relay 92. The self-test comparator 90 and relay 92 operate similarly to the signal comparator 86 and signal relay 88 discussed above. Particularly, the self-test comparator 90 and self-test relay are used in conjunction with the self-test circuit 74 to determine operability of the level instrument 10. The operation of the signal comparator 86 and self-test comparator 90 are supervised by a synchro circuit 94.

Figure 5:
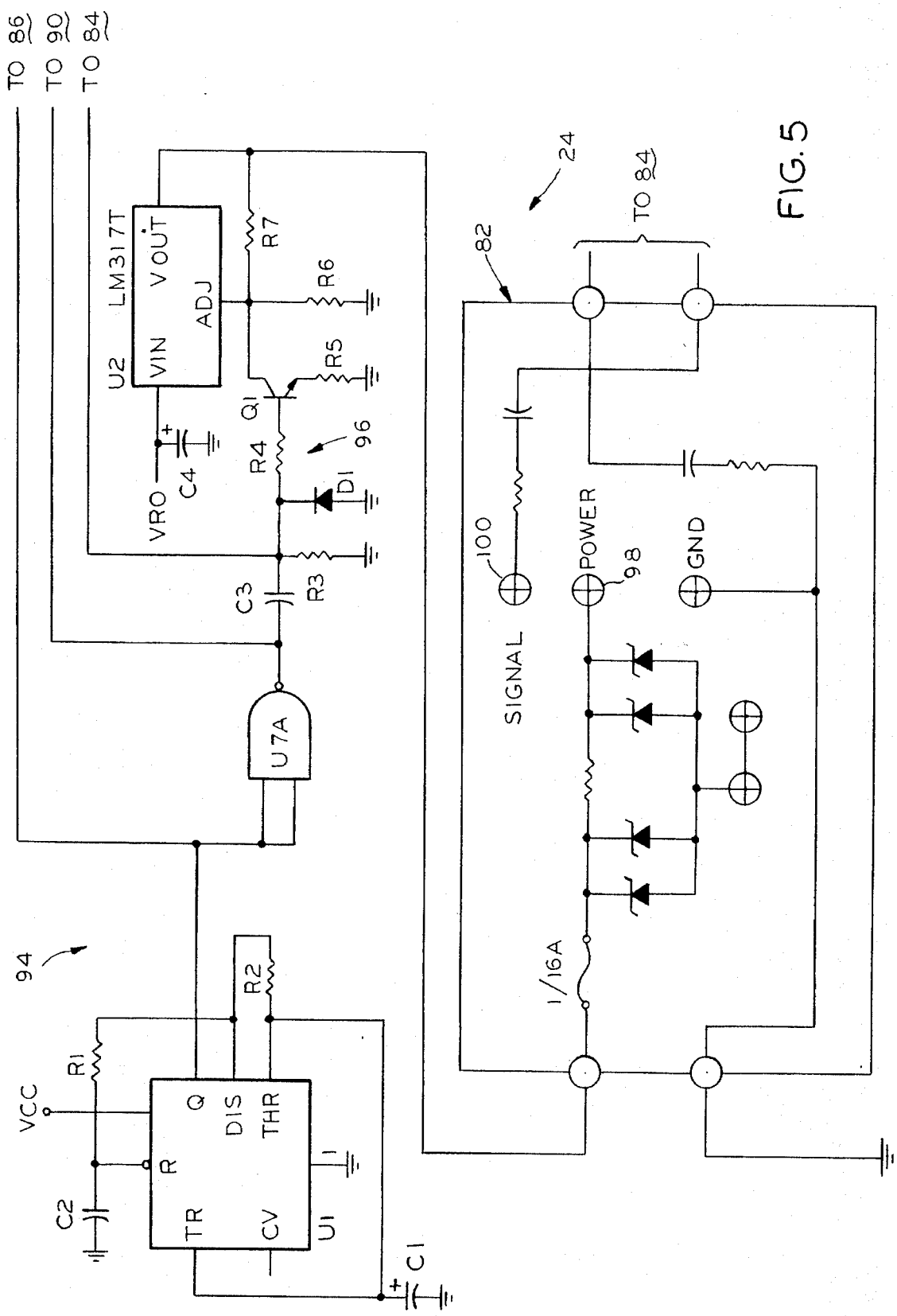
FIG. 5 is a schematic drawing of the synchro circuit shown in the block diagram of FIG. 2.

With reference to FIG. 5, an electrical schematic illustrates the circuitry for the synchro circuit 94 and the intrinsic safety barrier 82.

A timer circuit U1, such as an ICM 7555 integrated circuit, generates a negative pulse of 600 milliseconds every ten seconds. The leading edge starts the self-test cycle. The pulse is delivered to an inverter U7A which along with a capacitor C3, a resistor R3 and a diode D1, which make up a differentiator, create a short, positive pulse at the beginning of every self-test cycle. A voltage regulator U2 provides 16.5 volt DC power for the sensing unit 20. A transistor Q1 between the differentiator 96 and the regulator U2 is used as a modulator. It pulls down the output voltage from the regulator U2 for about twenty microseconds. The output voltage from the regulator U2 is delivered via the intrinsic safety barrier 82 to a power terminal 98 delivered on the line 76 to the sensing unit 20, see FIG. 2. The pulling down of the output voltage is detected in the sensing unit which initiates the self-test routine, as described below. The signal on the line 72 is received at a signal terminal 100 as delivered to the voltage to frequency converter 84.

The pulse output from the timer U1 is also delivered to the signal comparator 86, while the output from the inverter U7A is delivered to the self-test comparator 90. This disables the signal channel output during self-test, while enabling the self-test channel. The junction between the capacitor C3 and the resistor R3 is delivered to the frequency to voltage converter 84. This allows control of the function of the frequency to voltage converter 84 in the self-test mode and enables the unit 10 to detect broken wires between the power supply unit 24 and the sensing unit 20 in the self-test mode.

Figure 6:
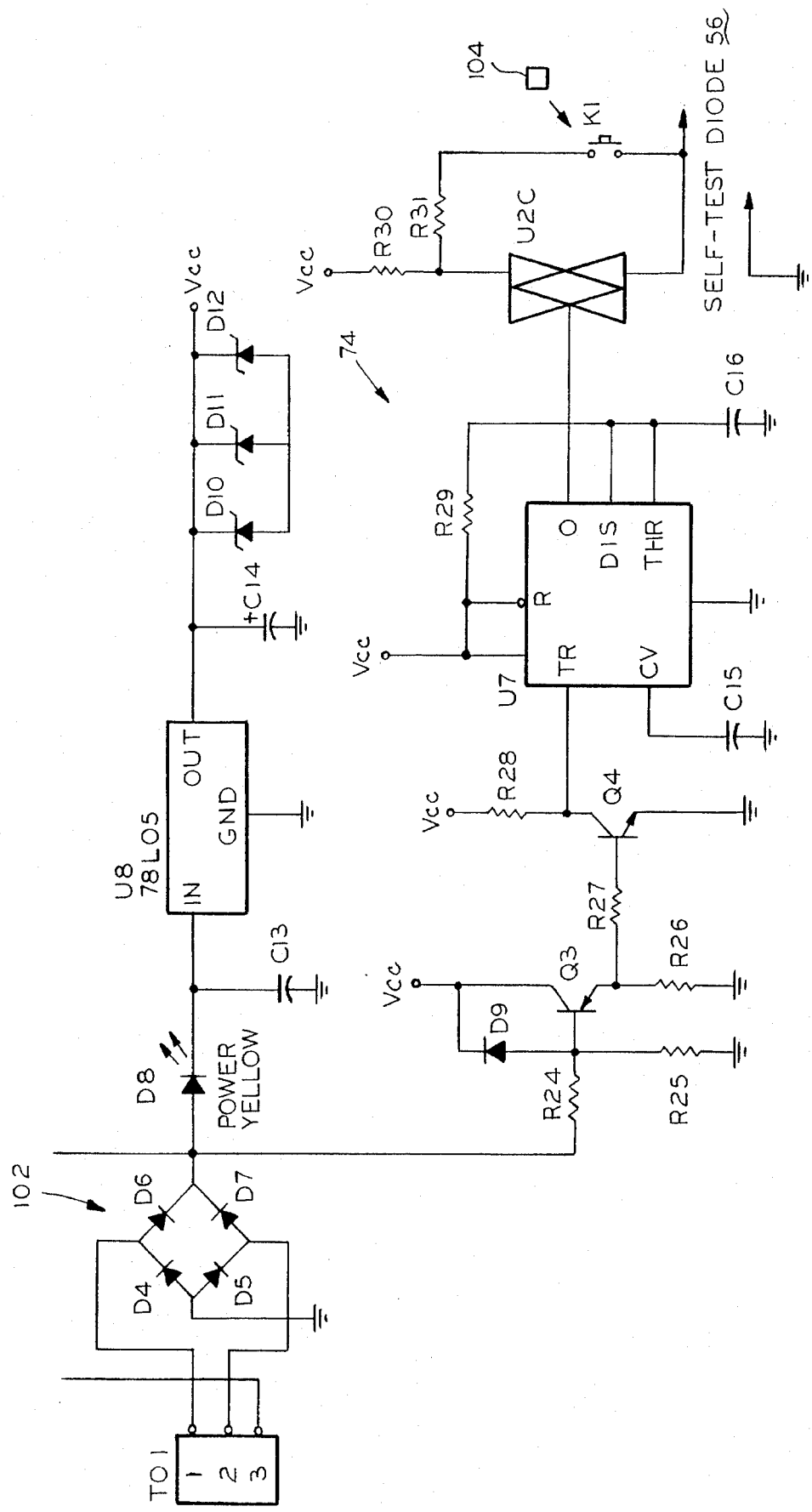
FIG. 6 is an electrical schematic of the self-test circuit shown in the block diagram of FIG. 2.

Referring to FIG. 6, an electrical schematic illustrates circuitry for the self-test circuit 74 of FIG. 2. Input power from the power supply unit 24 is received at a terminal block TB1 and is delivered to a full wave rectifier circuit 102. This power is delivered to a voltage regulator circuit U6 for providing regulated power and to a transistor Q3 which detects the start self-test pulse, i.e. when the delivered power is pulled down. The output of the transistor Q3 is inverted by a transistor Q4 which starts a single shot timer circuit U7. The output of the self-test circuit U7 comprises a 70 millisecond pulse which turns on a switch U2C which creates self-test current through the self-test diode 56. Manual testing is initiated by approaching a reed relay K1 with a permanent magnet 104. The sensing unit 20 includes a mark on its outside so that there is no need to open up the cover. The magnet in proximity to the read switch K1, the switch closes to create self-test current through the self-test diode 56.

The self-test diode 56 works similar to p-i-n attenuators. When current is supplied through the self-test diode 56, it changes impedance in the reference arm 38 of the waveguide 34 to simulate effects of change of dielectric properties of a product at the process seal 32. This change produces an imbalance condition which is sensed by the detector diode 52 and thus the sensing unit 20. The indicating voltage is sent to the power supply unit 24, as described above. The synchro circuit disables the signal comparator 86 and enables the self-test comparator 90. If the unit 10 is not operating properly, then the self-test relay 92 will be actuated. A time delay is provided in the signal comparator 86 so that its output will not change when it is disabled.

The described self-test technique allows the instrument 10 to check all of its components, including the Gunn oscillator 44, the detector diode 52, electronic circuitry and the three wire interface between the sensing unit 20 and power supply unit 24.

Figure 7:
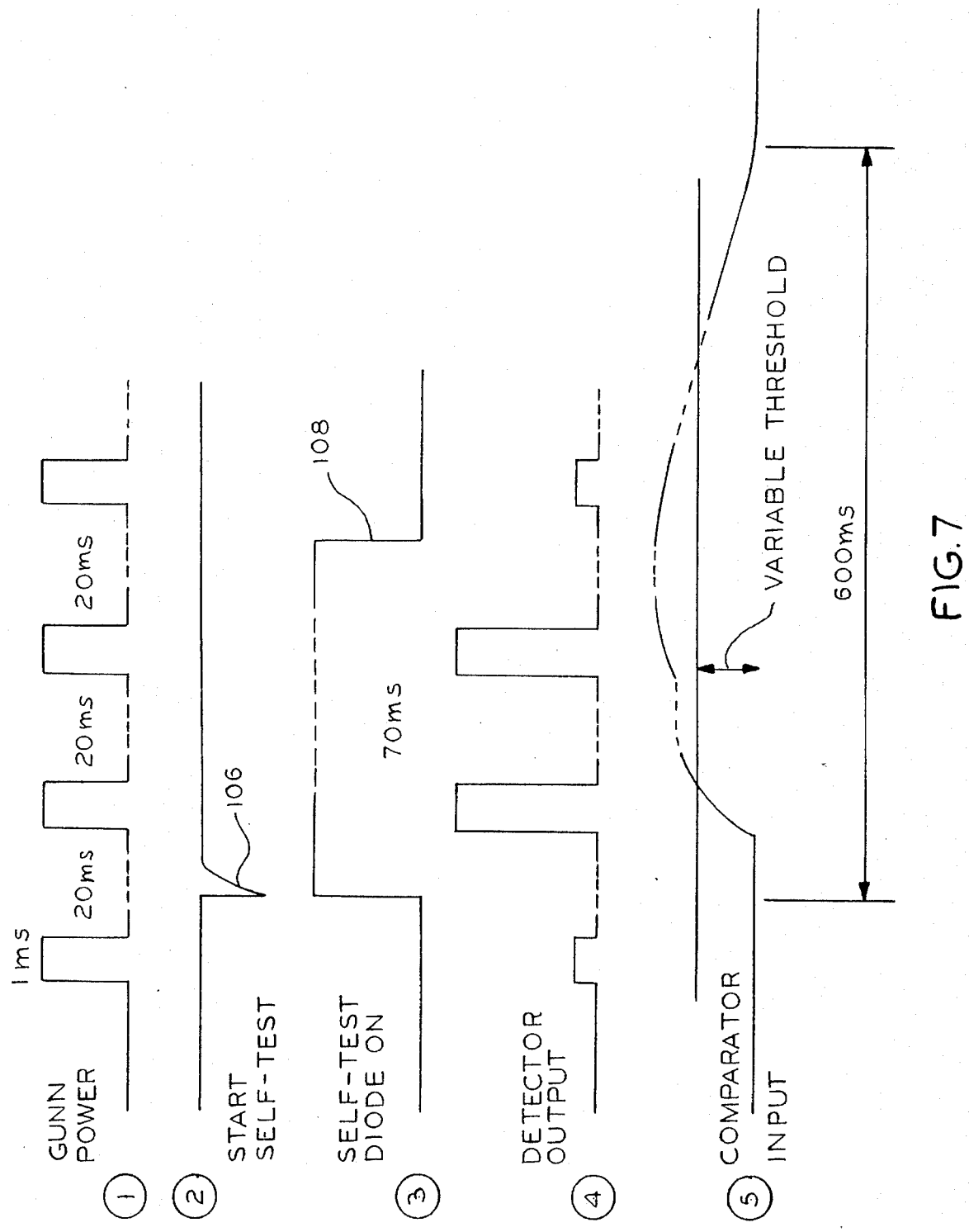
FIG. 7 is a timing diagram illustrating operation of the point level instrument of FIG. 1.

With reference to FIG. 7, a timing diagram illustrates operation of the instrument 10. Curve 1 illustrates power delivered from the Gunn power circuit 62, see FIG. 2, to the Gunn oscillator 44 comprising a one millisecond pulse every 20 milliseconds. Continuous self-test is synchronized from the free running timer U1, see FIG. 5 which initiates self-test routine every ten seconds in the power supply unit 24. The start self-test pulse 106, curve 2, triggers the single shot pulse from the single shot timer U7, see FIG. 6 to drive the self-test diode 56 using a 70 millisecond pulse 108, curve 3. This duration of 70 milliseconds is selected to allow for at least two Gunn power pulses to take place during the self-test. Detector voltage is sharply increased, as illustrated in curve 4, and the self-test comparator 90 trips and resets a flip-flop (not shown) that actuates the self-test relay 92. To eliminate false triggering, the signal channel is disabled by the synchro circuit 94 disabling the signal comparator 86, see FIG. 2 for 600 milliseconds, as illustrated in curve 5. The self-test channel is enabled by the start self-test pulse and disabled by the self-test comparator's triggering.

The manual self-test override is activated by approaching the particular location on the sensing unit 20 with a permanent magnet. The reed relay K1 located behind the housing trips and turns on current source through the self-test diode 56. This drives the unit out of balance, and increases drastically the detector's voltage and trips the signal comparator 86 to actuate the signal relay 88. This condition exists for as long as the permanent magnet is being held in front of the reed relay K1. This allows a user to manually verify the unit's functionality without opening covers.

Figure 8:
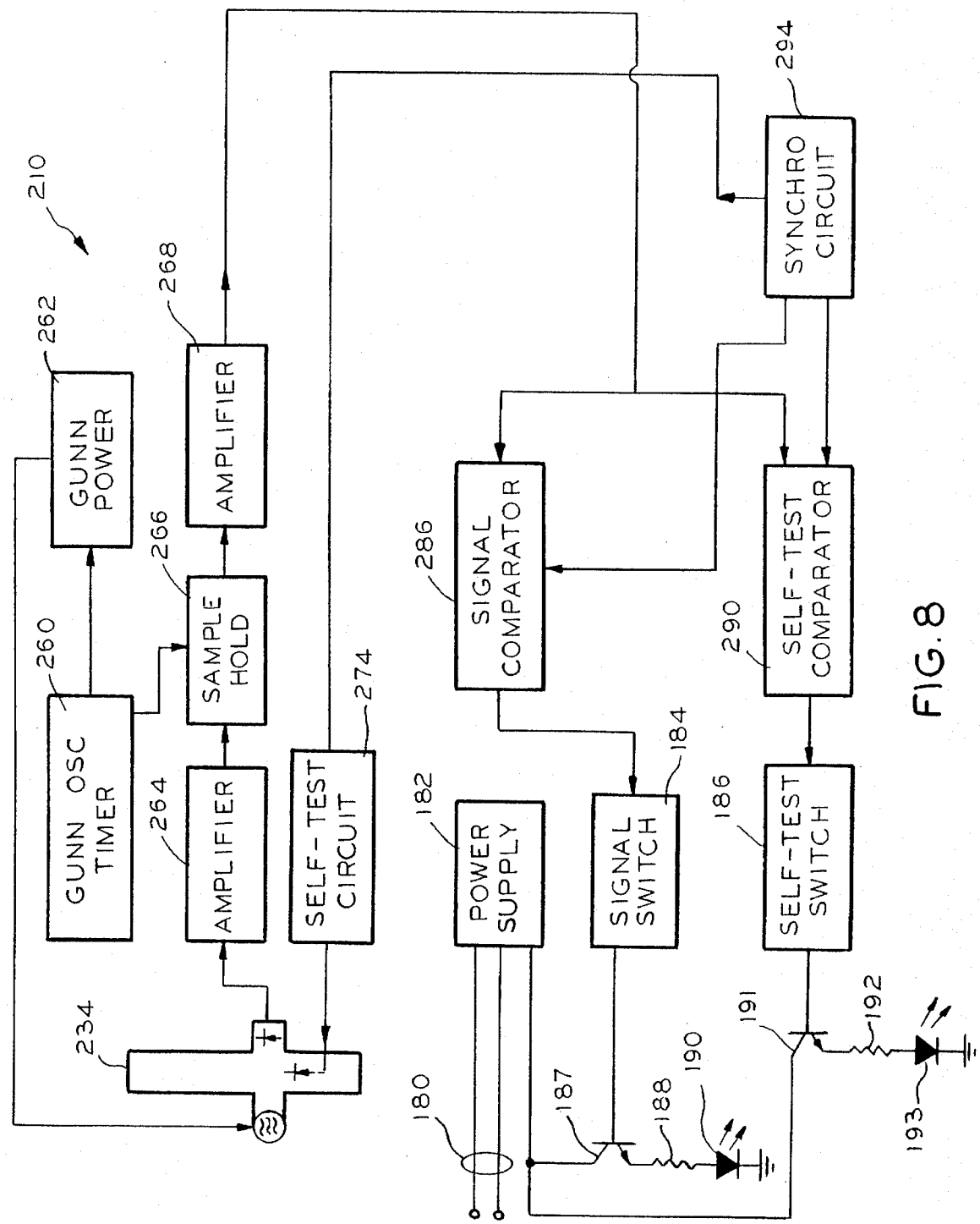
FIG. 8 is a block diagram similar to FIG. 2 for a loop powered version of the point level instrument.

Referring to FIG. 8, a block diagram illustrates an alternative embodiment comprises a loop powered microwave point switch 210. The microwave point switch 210 is functionally similar to the point switch 10 shown above relative to the block diagram of FIG. 2. For simplicity, like components are illustrated with similar reference numerals, in a 200 series, to indicate commonality of function. For example, the Gunn oscillator timer 60 of FIG. 2 is similar to the Gunn oscillator timer 260 of FIG. 8. Like components are not described in detail herein.

In the loop powered unit, only a single housing is required as all circuits included in that housing. The devices operates from a two wire 4–20 milli amp current loop received at input line 180 to a power supply 182. Because only a single unit is used, there is no need for voltage to frequency conversion or intrinsic safety barriers. The signal comparator 286 drives a signal switch 184, while the self-test comparator 290 drives a self-test switch 186. The signal switch 184 drives a transistor 187 which connects power from the power supply 82 to the series connection of a resistor 188 and LED 190. The self-test switch drives a transistor 191 from the power supply 182 to the series connected resistor 192 and LED 193.

With the loop power version, the Gunn oscillator timer 260 uses 0.7 millisecond on time, 30 millisecond off time resulting in a 2% duty cycle. This reduces power requirements. If a shorter duty cycle is selected the sample and hold circuit 266 may not retain its signal level. The circuit is particularly configured so that in a balance mode, the power supply 182 draws 8 milli amps on the loop lines 180. When the system is out of balance, as occurs when the transistor 187 is energized, the resistor 188 and LED 199 draw additional current so that 16 milli amps is drawn on the loop. Conversely, when self-test operation is not successful, the self-test switch 186 turns on the transistor 191 so that current is drawn by the resistor 192 and LED 193 so that the power supply 182 draws 22 milli amps. Thus, instead of using relays to provide on/off type outputs to indicate the status of the switch or self-test operability, remote instrumentation connected to the loop 180 detect current level to determine the status of the instrument 210.

Figure 9:
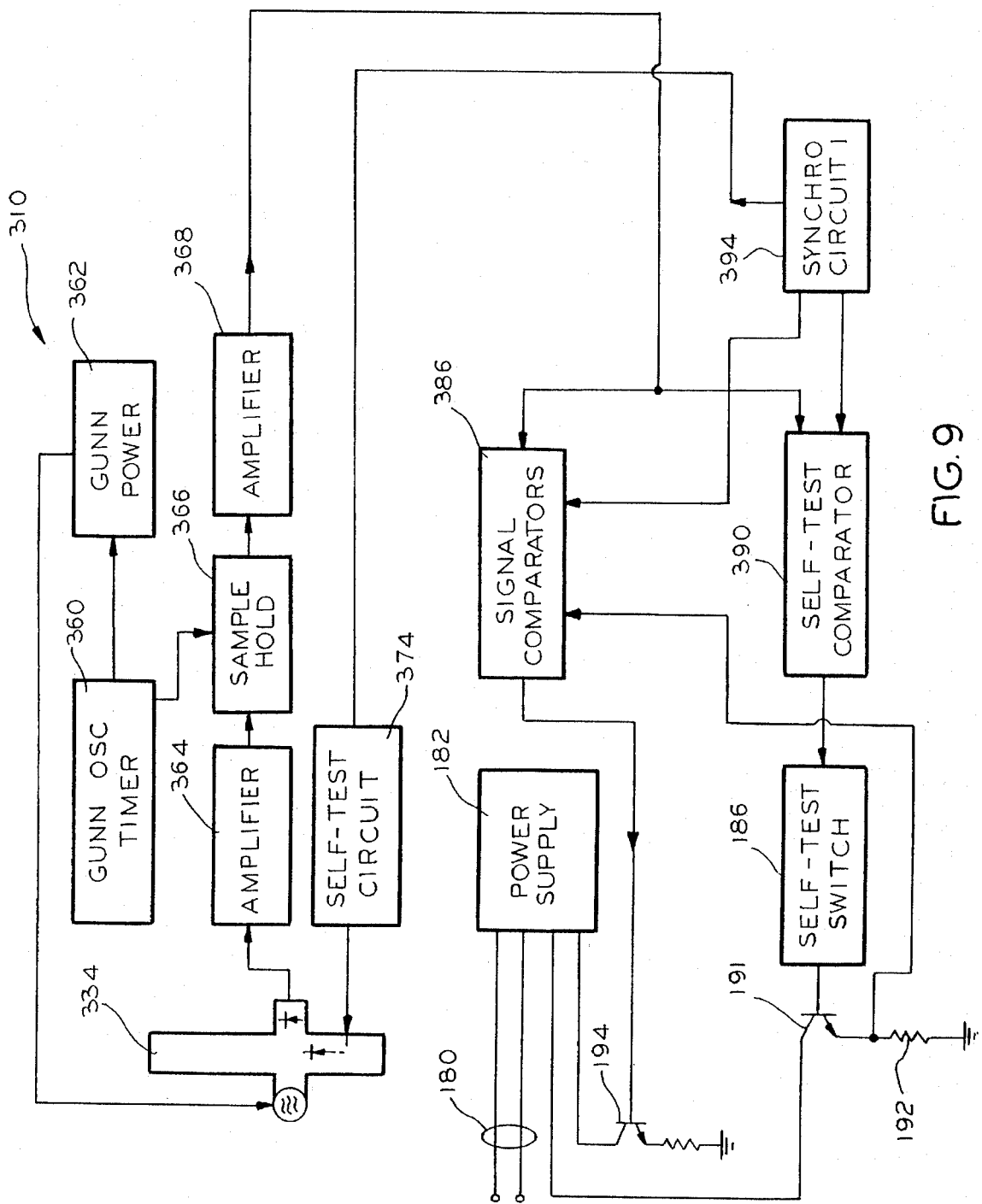
FIG. 9 is a block diagram similar to that of FIG. 8 illustrating application of the point level instrument as a permittivity analyzer.

Referring to FIG. 9, a microwave sensing instrument 310 in the form of a permittivity analyzer is illustrated. This version is generally similar to that described above relative to FIG. 8 in that the permittivity analyzer 310 comprises a loop powered unit receiving power on lines 180 to the power supply 182. However, the signal comparator 386 comprises an amplifier circuit for variably driving a transistor 194 to draw variable power according to the signal level from the amplifier 368. Thus, loop current is continuously varied between 4–20 milliamps generally proportional to the detected signal. Particularly, loop current is set to 4 milliamps when the output of the microwave bridge is null. Maximum dielectric permittivity yields 20 milliamp output and may be calibrated by placing a sample of such product in front of the process seal 32. Any signal in between indicates an intermediate dielectric permittivity which can be evaluated by the remote instrumentation to determine the particular material 16 in the vessel 12. The self-test switch 186 operates the transistor 191 to draw additional current so that in self-test operation, 22 milliamps of current in drawn on the loop 180.

Thus, in accordance with the invention, there is disclosed a microwave point level switch including a continuously and automatically operating self-test function. The self-test function can be used in conjunction with a relay version and loop powered version of the instrument as well as when the instrument is configured as a permittivity analyzer.

I claim:

1. A microwave point level instrument adapted to detect level or change of products in a storage vessel, comprising:

a microwave transducer periodically developing a pulse of microwave energy;

a microwave bridge driven by the transducer for receiving pulses of microwave energy, the bridge including tunable reference means receiving a portion of each pulse of microwave energy to be altered by a variable impedance tuning circuit, measurement means for receiving another portion of each pulse of microwave energy to be altered by dielectric properties of a product at a process seal installed in a storage vessel, in use, and a detector means for developing a microwave signal responsive to imbalance in the bridge between the microwave energy altered by the tuning means and the microwave energy altered by the dielectric properties of the product;

sensing means coupled to the bridge detector means for developing an electrical signal responsive to the microwave signal representing said imbalance;

a self-test circuit operatively associated with said bridge for automatically varying impedance in said bridge to simulate effects of a change of dielectric properties of a product at the process seal; and an output circuit including means operatively driven by said sensing means for indicating the determined imbalance.

2. The microwave point level instrument of claim 1 wherein said microwave bridge comprises a Magic-T bridge waveguide.

3. The microwave point level instrument of claim 1 wherein said tunable reference means comprises capacitive and resistive tuning elements.

4. The microwave point level instrument of claim 1 wherein said self-test circuit varies impedance of said tunable reference means.

5. The microwave point level instrument of claim 4 wherein said microwave bridge comprises a waveguide having a reference arm and a measurement arm, said reference arm including said tunable reference means and said measurement arm includes said process seal.

6. The microwave point level instrument of claim 5 wherein said self-test circuit comprises a tuning element disposed in said reference arm.

7. The microwave point level instrument of claim 6 wherein said tuning element comprises a diode in said waveguide reference arm.

8. The microwave point level instrument of claim 1 wherein said self-test circuit includes a timer circuit for periodically driving a tuning element operatively associated with said tuning circuit.

9. The microwave point level instrument of claim 1 wherein said self-test circuit comprises a magnetically actuated switch for driving a tuning element operatively associated with said tuning circuit when a magnet is placed in proximity to said instrument.

10. The microwave point level instrument of claim 1 wherein said output means develops a null signal when said bridge is in a balance condition and said output circuit comprises a comparator circuit for comparing said electrical signal to a reference to develop an output signal having a discrete state depending on the balance condition of the bridge.

11. The microwave point level instrument of claim 10 wherein said output circuit comprises a relay actuated according to the discrete state of the output signal.

12. The microwave point level instrument of claim 10 wherein said instrument comprises a loop powered instrument receiving a current signal and wherein said output circuit varies level of loop current according to the discrete state of the output signal.

13. The microwave point level instrument of claim 1 wherein said output means develops a null signal when said bridge is in a balance condition and said output circuit comprises a comparator circuit for comparing said electrical signal to a reference to develop a proportional output signal having a level depending on the balance condition of the bridge.

14. The microwave point level instrument of claim 13 wherein said instrument comprises a loop powered instrument receiving a current signal and wherein said output circuit varies level of loop current according to the level of the output signal.

* * * * *